Aug. 20, 1968 D. F. G. DWYER 3,398,380
AMPLITUDE STABILIZED CRYSTAL OSCILLATOR
Filed June 21, 1966
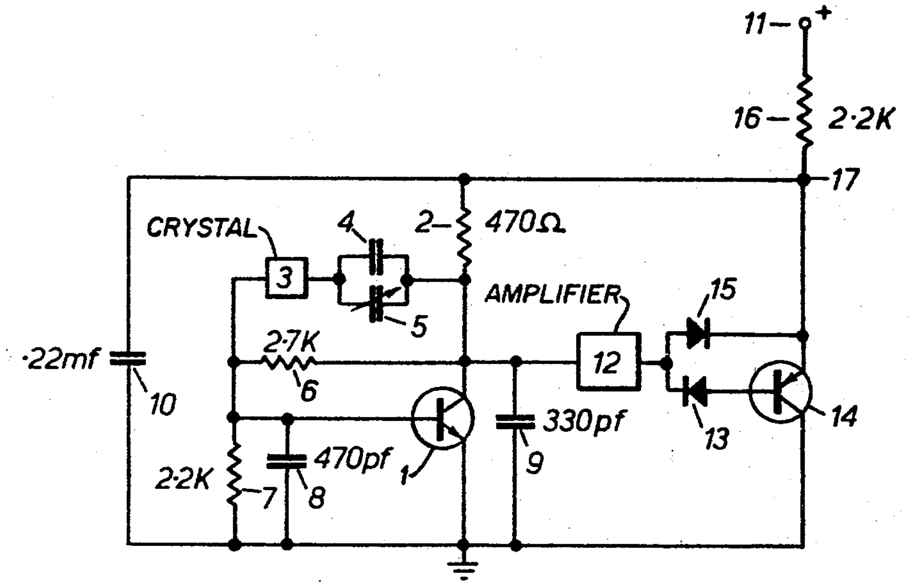
INVENTOR
Douglas Frank George Dwyer
BY
Baldwin, Wight, Diller & Brown
ATTORNEYS United States Patent Office 3,398,380
Patented Aug. 20, 1968

3,398,380
AMPLITUDE STABILIZED CRYSTAL OSCILLATOR

Douglas Frank George Dwyer, Ewell, England, assignor to The Marconi Company Limited, London, England, a British company Filed June 21, 1966, Ser. No. 559,131
Claims priority, application Great Britain, Aug. 16, 1965, 34,956/65
6 Claims. (Cl. 331—109)

ABSTRACT OF THE DISCLOSURE

A transistor driven piezo-electric crystal oscillator is disclosed herein in which the amplitude of oscillation is automatically maintained at a desired predetermined value by means of a D.C. control voltage which is developed to be dependent upon the produced oscillation amplitude of the oscillator, the control voltage being applied to control the effect of supply voltage to the oscillator while the base-emitter voltage of the driving transistor is maintained substantially unchanged. In a specific embodiment, oscillations from the oscillator are rectified and applied to control the impedance of a second transistor which forms part of a voltage divider chain, a tap upon which is employed as the supply voltage source for the oscillator.

This invention relates to transistor driven piezo-electric crystal oscillators and more specifically to such oscillators of the kind in which control of the level of oscillation is automatically maintained at a desired predetermined value.

It is found in practice that if the oscillation level of a piezo-electric crystal is permitted to rise above a certain amount—commonly about ½ $\mu$W.—the crystal will age rapidly and considerable consequent undesired variation in frequency will result. Further, if the oscillation level is permitted to vary materially, even though always below the level above mentioned, the frequency will vary with variation in level. Usual known practice is to meet these difficulties by deriving a D.C. control voltage dependent upon the produced level of oscillation and applying this voltage to the base of the driving transistor to alter its gain in a direction to compensate for a change in level which has occurred. If this is done, however, accompanying variation of emitter-base capacity occurs and this produces an undesired change in frequency. The present invention seeks to overcome this defect.

According to this invention a transistor driven crystal oscillator of the kind referred to comprises means for developing a D.C. control voltage dependent upon the produced oscillation level of the oscillator and means for applying said control voltage to control the effective supply voltage to the oscillator while maintaining the base-emitter voltage substantially unchanged by the applied control.

Preferably oscillations derived from the oscillator are rectified and applied to control the impedance of a second transistor which forms part of a potentiometer a tap upon which is employed as the supply voltage source for the oscillator.

Preferably the derived oscillations are applied through a first diode to the base of the second transistor and an oppositely poled second diode has its "cathode" side connected to the emitter of said second transistor and its "anode" side connected to the "cathode" side of the first diode, the collector of said second transistor being "earthed." With this arrangement a maximum signal applied to control the second transistor is obtained.

The invention is illustrated in the accompanying drawing which shows one embodiment diagrammatically.

Referring to the drawing the active element of the oscillator is a transistor 1 with a resistance 2 in its collector circuit. The crystal 3 is in series with a parallel connected trimming condenser combination 4, 5, between the collector and the base. A resistance 6 is also connected between said collector and said base. A resistance 7 in parallel with a condenser 8 is between the base and the earthed emitter and a condenser 9 is connected between the collector and the emitter. A condenser 10 is connected to earth from the point 17, which is, as will be seen later, the effective potential supply point for the oscillator. The oscillator forms per se no part of this invention but may be constructed in accordance with the foregoing description thereof and the schematic illustration contained in the accompanying drawing. The impedance values of the resistance-capacity elements in the maintaining circuit of the oscillator are so chosen that the impedance presented by the crystal, when operating in the desired mode, is substantially matched by that presented by the other elements in said maintaining circuit.

Oscillations are taken from the collector of transistor 1, amplified by an amplifier 12 and applied through a diode 13, poled as shown, to the base of a transistor 14, there being provided a second oppositely pole diode 15 having its "cathode" side connected to the emitter of transistor 14 and its "anode" side connected to the "cathode" side of diode 13.

The transistor 14 is arranged to act as a voltage variable impedance in a potentiometer the other portion of which is constituted by a resistance 16 in the connection between the emitter and a source of positive potential connected at 11. Thus the intermediate point 17 is used as shown, as the effective supply potential point for the oscillator and it will be seen that, if the oscillation level increases, the voltage supply to the oscillator falls and vice versa. The application of negative feed-back to the base of the transistor 1 via the resistor 6 sustains the voltage across the resistor 7. Thus, the base-emitter voltage of the transistor 1 is maintained substantially unchanged over the range of corrective changes in the potential at the point 17.

Practical values of elements are shown in the drawing for the case of a crystal operating at its fifth overtone at a frequency of 2.5 mc./s. at which frequency it presents a parallel characteristic impedance of about 5000 ohms. In this case a suitable value for the resistance 16 is, as shown, 2.2K. The foregoing figures are, it is to be understood, given by way of example only.

I claim:

1. A transistor driven crystal oscillator of the kind in which control of the amplitude of oscillation is automatically maintained at a desired predetermined value and comprising an oscillator driving transistor, means for developing a D.C. control voltage dependent upon the produced oscillation amplitude of the oscillator and means for applying said control voltage to control the effective supply voltage to the oscillator while maintaining the base-emitter voltage of the driving transistor substantially unchanged by the applied control.

2. An oscillator as claimed in claim 1 wherein said means for developing a D.C. control voltage comprises means for rectifying oscillations derived from the oscillator, voltage divider means for providing the D.C. control voltage at a tap point thereof and including a second transistor, and means for applying rectified oscillations from said means for rectifying to control the impedance of said second transistor and the D.C. control voltage.

3. An oscillator as claimed in claim 2 wherein said means for rectifying the derived oscillations comprises a first diode connected to the base of the second transistor and an oppositely poled second diode having its "cathode" side connected to the emitter of said second transistor and its "anode" side connected to the "cathode" side of the first diode, the collector of said second transistor being "earthed."

4. A substantially constant amplitude transistor oscillator comprising crystal controlled oscillator means having at least one transistor for producing an oscillatory signal and crystal frequency control means for determining the frequency of said oscillatory signal, means for supplying a D.C. control voltage to said crystal controlled oscillator means including means responsive to the amplitude of said oscillatory signal for controlling the D.C. control voltage and feed-back means for maintaining the base-emitter voltage of said at least one transistor substantially unchanged.

5. An oscillator according to claim 4 wherein said amplitude responsive means comprises signal variable impedance means, means for applying a current to said impedance means to establish a D.C. voltage thereacross and means interconnecting said crystal controlled oscillator means and said signal variable impedance means for controlling the impedance thereof in dependance upon the amplitude of the oscillatory signal to effect control of the D.C. voltage across said impedance means.

6. An oscillator according to claim 5 wherein said signal variable impedance means comprises a second transistor, said means for controlling the impedance thereof comprising means for increaisng the conduction of said second transistor in response to increases in the amplitude of the oscillatory signal to vary the D.C. voltage across the second transistor.

References Cited

FOREIGN PATENTS 511,745 6/1952 Belgium.

OTHER REFERENCES

M. R. Cannon, "Stabilized Transistor Oscillator," IBM Technical Disclosure Bulletin, vol. 1, No. 1, June 1958, p. 32.

ROY LAKE, *Primary Examiner.*

S. H. GRIMM, *Assistant Examiner.*